(12) United States Patent
Döllgast et al.

(10) Patent No.: US 7,851,974 B2
(45) Date of Patent: Dec. 14, 2010

(54) PIEZOCERAMIC MULTILAYER ACTUATOR MANUFACTURED ACCORDING TO PARTICULAR SINTERING PARAMETERS AND CORRESPONDING METHOD OF MANUFACTURING

(75) Inventors: Bernhard Döllgast, Deutschlandsberg (AT); Masahiro Inagaki, Kagoshima (JP); Harald Johannes Kastl, Fichtelberg (DE); Atsushi Ochi, Yokohama (JP); Takami Sakamoto, Kagoshima (JP); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 76 days.

(21) Appl. No.: 12/032,465

(22) Filed: Feb. 15, 2008

(65) Prior Publication Data

US 2008/0224572 A1    Sep. 18, 2008

(30) Foreign Application Priority Data

Feb. 19, 2007    (EP)    ................................. 07003445

(51) Int. Cl.
    *H01L 41/04*    (2006.01)
    *H01L 41/08*    (2006.01)
(52) U.S. Cl. .................. 310/328; 310/365; 310/366
(58) Field of Classification Search .............. 310/328, 310/363–633
    See application file for complete search history.

(56) References Cited

U.S. PATENT DOCUMENTS

| | | | |
|---|---|---|---|
| 4,932,119 A | 6/1990 | Ealey et al. | 29/593 |
| 5,089,739 A * | 2/1992 | Takahashi et al. | 310/328 |
| 5,406,164 A | 4/1995 | Okawa et al. | 310/366 |
| 5,835,338 A * | 11/1998 | Suzuki et al. | 361/301.4 |
| 7,498,726 B2 * | 3/2009 | Mochizuki et al. | 310/364 |
| 7,518,295 B2 * | 4/2009 | Mochizuki et al. | 310/366 |
| 7,545,080 B2 * | 6/2009 | Kastl et al. | 310/328 |
| 7,598,660 B2 * | 10/2009 | Kobayashi et al. | 310/366 |
| 2003/0080651 A1* | 5/2003 | Murai et al. | 310/328 |
| 2004/0178701 A1 | 9/2004 | Sato et al. | 310/328 |
| 2006/0043841 A1 | 3/2006 | Kadotani et al. | 310/328 |
| 2006/0055288 A1 | 3/2006 | Heinzmann et al. | 310/364 |
| 2006/0181178 A1 | 8/2006 | Kastl et al. | 310/328 |
| 2006/0238073 A1 | 10/2006 | Ragossnig et al. | 310/328 |

(Continued)

FOREIGN PATENT DOCUMENTS

DE    10307825 A1    2/2003

(Continued)

OTHER PUBLICATIONS

European Search Report; EP 07 00 3445; pp. 3, Jul. 11, 2007.

(Continued)

*Primary Examiner*—J. SanMartin
(74) *Attorney, Agent, or Firm*—King & Spalding L.L.P.

(57) ABSTRACT

A piezoceramic multilayer actuator (10) has a plurality of piezoceramic layers (12), a security layer (20) and a plurality of inner electrodes (16, 18). The piezoceramic layers (12) has a piezoceramic first material sintered at a sintering temperature. The security layer (20) has a second material and is disposed between two piezoceramic layers (12). Each of the plurality of inner electrodes (16, 18) has a third material and is deposited between two piezoceramic layers (12). The degree of sintering of the second material is lower than the degree of sintering of the third material.

16 Claims, 2 Drawing Sheets

U.S. PATENT DOCUMENTS

2009/0077782 A1\* 3/2009 Takabe ...................... 29/25.35
2009/0278422 A1\* 11/2009 Florian et al. ............... 310/326

FOREIGN PATENT DOCUMENTS

| DE | 102004031404 A1 | 6/2004 |
| --- | --- | --- |
| WO | WO 03105246 A2 | 12/2003 |
| WO | WO 2006000479 A1 | 1/2006 |
| WO | WO 2006/042791 A1 | 4/2006 |
| WO | WO 2006103154 A1 | 10/2006 |
| WO | WO 2006/131106 A2 | 12/2006 |

OTHER PUBLICATIONS

European Search Report for Application No. EP 07 00 3446 (3 pages), Jul. 13, 2007.
European Search Report for Application No. EP 07 00 3447 (3 pages), Jul. 27, 2007.

\* cited by examiner

PIEZOCERAMIC MULTILAYER ACTUATOR MANUFACTURED ACCORDING TO PARTICULAR SINTERING PARAMETERS AND CORRESPONDING METHOD OF MANUFACTURING

CROSS-REFERENCE TO RELATED APPLICATIONS

This application claims priority to European Patent Application Number 07003445 filed on Feb. 19, 2007, and which is incorporated herein by reference in its entirety.

TECHNICAL FIELD

The present invention refers to a piezoceramic multilayer actuator and a method of manufacturing a piezoceramic multilayer actuator.

BACKGROUND

Piezoceramic multilayer actuators convert electrical signals to mechanical operation. A voltage applied to electrodes of the piezoceramic multilayer actuator causes the actuator to change its length due to piezoelectric properties of a multitude of piezoceramic layers. The inner electrodes and the piezoceramic layers are alternatingly arranged in a stack. Every other inner electrode is electrically conductively connected to a first outer electrode, and every other inner electrode is electrically conductively connected to a second outer electrode. Each piezoceramic layer is arranged between one inner electrode connected to the first outer electrode and one inner electrode connected to the second outer electrode. Piezoceramic multilayer actuators like this are used to drive or control mechanics, fluids etc. Fuel injectors for combustion engines are an important application.

After manufacture, a large voltage is applied to the piezoceramic multilayer actuator. This large voltage polarizes the piezoceramic layers and causes a remanent deformation of the piezoceramic layers. In the vicinity of the outer electrodes, every other inner electrode does not completely extend to the edges of the adjacent piezoceramic layers but is isolated from the outer electrode. This causes inhomogeneous electrical fields within the piezoceramic layers and an inhomogeneous remanent distortion as well as inhomogeneous distortions during the normal operation of the actuator. Any inhomogeneous distortion as well as any imperfection of the piezoceramic multilayer actuator causes mechanical strain and stress within the actuator. In particular under highly dynamic operating conditions and at high temperatures, cracks at the interfaces between inner electrodes and piezoceramic layers, at the interfaces between the active stack and inactive top or bottom layers and within the piezoceramic layers result. Branching cracks or cracks growing in the stacking direction are particularly detrimental. As soon as a crack electrically insulates a part of an inner electrode, the inhomogenity is further increased and the growth of cracks is accelerated. Furthermore, chemically reactive fluids may intrude into the cracks and chemically destroy the piezoceramic layers and/or the inner electrodes.

SUMMARY

A more robust piezoceramic multilayer actuator can be provided according to an embodiment by a piezoceramic multilayer actuator comprising a plurality of piezoceramic layers comprising a piezoceramic first material sintered at a sintering temperature; a security layer comprising a second material and disposed between two piezoceramic layers; and a plurality of inner electrodes comprising a third material, each of the inner electrodes being deposited between two piezoceramic layers, wherein the degree of sintering of the second material is lower than the degree of sintering of the third material, the degree of sintering referring to the sintering within the second and third materials, respectively, and/or to the degree of sintering at surfaces between the second and third materials, respectively, and the first material.

According to a further embodiment, the melting point of the second material can be higher than the melting point of the third material. According to a further embodiment, the second material can be essentially Pd or Pt. According to a further embodiment, the average ratio between the surface area and the volume of the grains of the second material can be lower than the average ratio between the surface area and the volume of the grains of the third material. According to a further embodiment, the average size of the grains of the second material can be larger than the average size of the grains of the third material. According to a further embodiment, the average shape of the grains of the second material can be different from the average shape of the grains of the third material. According to a further embodiment, the surfaces of the grains of the second material can be leached. According to a further embodiment, the grains of the second material may provide a coating reducing the sintering activity.

According to another embodiment, a method of manufacturing a piezoceramic multilayer actuator, may comprise the steps of providing a plurality of green layers, wherein the green layers are to be converted to piezoceramic layers comprising a piezoceramic material in a subsequent step of heating; providing a security layer material; providing an inner electrode material; laminating the security layer material between a first one and a second one of the plurality of green layers and laminating the inner electrode material between the second one and a third one of the plurality of green layers, thereby forming a green stack; and heating the green stack to a sintering temperature, wherein the green layers are converted to the piezoceramic layers, and wherein the degree of sintering of the security layer material is lower than the degree of sintering of the inner electrode material.

According to a further embodiment, the melting point of the security layer material can be higher than the melting point of the inner electrode material. According to a further embodiment, in the step of heating, the security layer material does not or substantially not sinter. According to a further embodiment, the security layer material essentially can be Pd or Pt.

BRIEF DESCRIPTION OF THE DRAWINGS

The present invention will now be described in more detail with reference to the Figures enclosed herewith. In the Figures.

DETAILED DESCRIPTION

Figure 1:
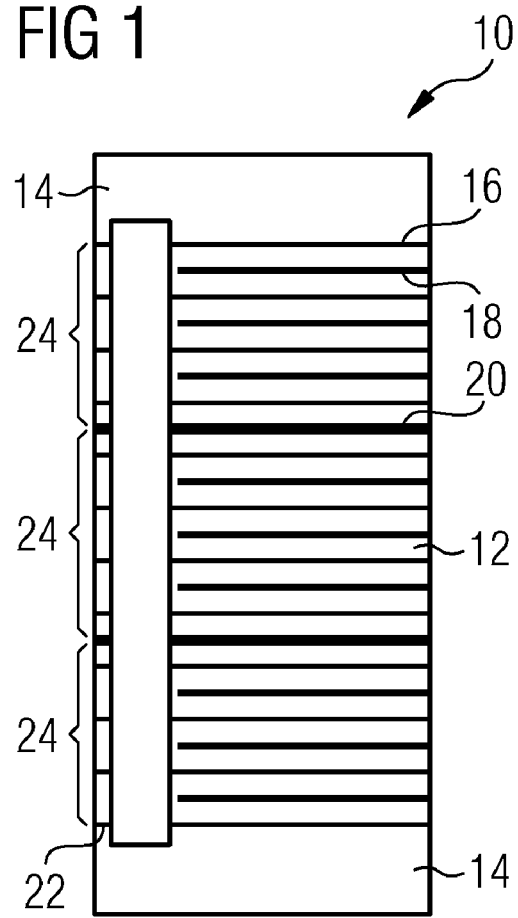
FIG. 1 is a schematic representation of a piezoceramic multilayer actuator.

The various embodiments are based on the idea to weaken, or degrade, or impair the mechanical connection between a piezoceramic layer and an adjacent security layer or between two neighbouring piezoceramic layers across a security layer thereby forming a predetermined breaking point within a piezoceramic multilayer actuator. For this purpose the material of the security layer is selected such that its degree of sintering is lower than the degree of sintering of inner electrodes of the piezoceramic multilayer actuator.

The lower degree of sintering is for example achieved by a melting point of the security layer material which is higher than a melting point of the inner electrode material. Preferably the difference of the melting points of the inner electrode material and the security layer material can be at least 100 K or at least 200 K or at least 300 K or at least 400 K.

As an alternative, the security layer material and the inner electrode material provide essentially the same melting point, and different sintering activities are achieved in other ways. For example, a lower sintering activity of the security layer material when compared to the inner electrode material is achieved by the particles or grains of the security layer material providing a smaller surface area than the particles or grains of the inner electrode material; and/or by the particles or grains of the security layer material providing a bigger diameter than the particles or grains of the inner electrode material; and/or by the shapes of the particles or grains of the security layer material being different from (in particular: more smooth or rough than) the shapes of the particles or grains of the inner electrode material; and/or by leached surfaces of the particles or grains of the security layer material; and/or by means of a coating on the particles of the security layer material, wherein the coating reduces the sintering activity.

According to an embodiment, the degree of sintering in the bulk of the security layer material is lower than the degree of sintering in the bulk of the inner electrode material. Alternatively or additionally the degree of sintering at a surface between the security layer and an adjacent piezoceramic layer is lower than the degree of sintering at a surface between the inner electrode and the piezoceramic layer. In the latter case, the sintering activity between particles of the security layer material and particles of the piezoceramic layer material is weaker than the sintering activity between particles of the inner electrode material and particles of the piezoceramic layer material.

Throughout this application, the statement that the degree of sintering of the security layer material is lower than the degree of sintering of the inner electrode material includes configurations in which the inner electrode material is partially or completely molten during burning or firing while the security layer material is not molten. For this purpose, the temperature of burning or firing of the piezoceramic multilayer actuator is higher than the melting point of the inner electrode material but lower than the melting point of the security layer material.

In other cases, the term "degree of sintering" is the degree of reduction of the voids between the particles of the materials. This degree is zero for the fresh or green material (before any step of heating or firing or burning) and is for example 100% when the respective material is or has been completely molten.

As an alternative, the degree of sintering is measured as the diameter of the bridges forming between particles during the process of sintering or as the ratio of this diameter to the diameter of the particles.

As a further alternative, the degree of sintering is measured or defined as the ratio between the tensile strength of the partially sintered material and the tensile strength after it is completely molten and solidified. A security layer material being Pd or Pt or essentially being Pd or Pt or mainly comprising Pd or Pt or any other material with a melting point above 1500° C. or with a melting point above 1700° C. is particularly advantageous because the sintering or firing or burning temperatures of most common piezoceramic materials and of most common inner electrode materials are considerably lower. In this way, due to the much higher melting point of the security layer material the degree of sintering of the security layer material is lower or even much lower than the degree of sintering of the inner electrode material.

The above described measures weaken the mechanical connection or linkage between a piezoceramic layer and an adjacent security layer or between two piezoceramic layers via a security layer. In this way, a security layer or an interface between the security layer and an adjacent piezoceramic layer form a predetermined breaking point. Mechanical strain causes the formation and growth of a crack within the security layer or along the interface between the security layer and the piezoceramic layer.

Preferably a piezoceramic multilayer actuator may comprise sub-stacks, each sub-stack comprising a predetermined number of piezoceramic layers and a corresponding number of inner electrodes. The security layers according to various embodiments are arranged between the sub-stacks. Mechanical strain induces cracks within the security electrodes but most probably not within the sub-stacks. Therefore, the operation and action of the sub-stacks is guaranteed and the reliability of the whole piezoceramic multilayer actuator is increased.

FIG. 1 is a schematic representation of a piezoceramic multilayer actuator 10 comprising a plurality of piezoceramic layers 12, a plurality of first inner electrodes 16 and a plurality of second inner electrodes 18. The piezoceramic layers 12 comprise a piezoceramic first material sintered at a sintering temperature and providing a piezoelectric effect. The first inner electrodes 16 are electrically conductively connected to a first outer electrode 22, and the second inner electrodes 18 are electrically conductively connected to a second outer electrode not displayed in FIG. 1. The first inner electrodes 16 are electrically insulated from the second outer electrode, and the second inner electrodes 18 are electrically insulated from the first outer electrode 22. Groups of piezoceramic layers 12 and inner electrodes 16, 18 form sub-stacks 24. Security layers 20 are arranged between the sub-stacks 24. Top and bottom of the piezoceramic multilayer actuator 10 are covered by top and bottom layers 14.

Figure 2:
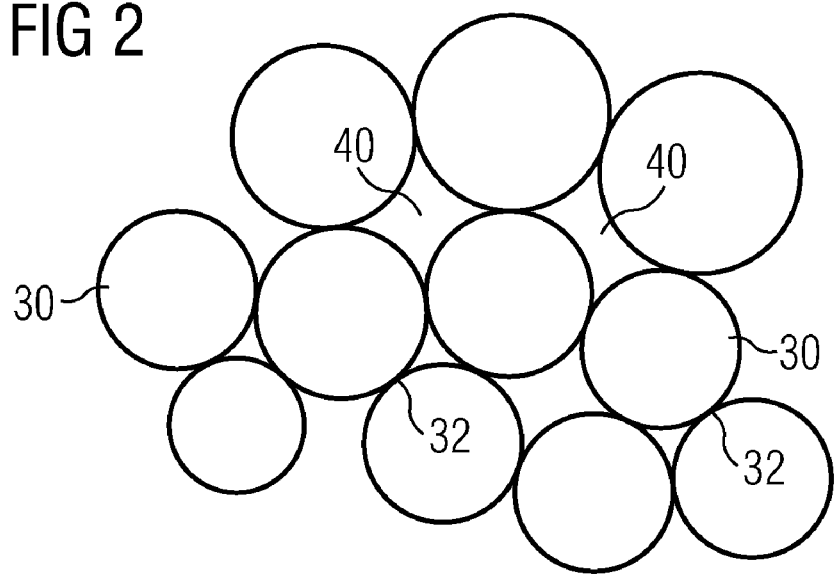
FIG. 2 is a schematic representation of the microstructure of a green security layer.

FIG. 2 is a schematic representation of a microstructure of a green or debindered green layer being a predecessor of one of the security layers 20 described above with reference to FIG. 1. The microstructure of the security layer material comprises granules or grains 30 with voids 40 in between. The grains 30 are in contact with each other at contact points 32. Apart from elastic or plastic deformation of the grains 30, the contact points 32 are very small. Elastic or plastic deformation of the grains 30 cause the contact points 32 to be more extended than only one or several atoms. However, the cohesion of the grains is rather weak in the green state.

When the green material is heated to an elevated temperature, a migration of material starts or, more strictly speaking, is intensified. For many materials used for ceramics and in particular for piezoceramic actuators, the migration of material can be ignored for low temperatures, in particular for room temperature. Usually there is a considerable migration of material at temperatures close to the melting point of the material. Usually ceramics, and in particular piezoceramic materials, are produced by heating the green material to a predetermined elevated temperature for a predetermined period of time. This process is usually called a firing or burning or sintering process.

Figure 3:
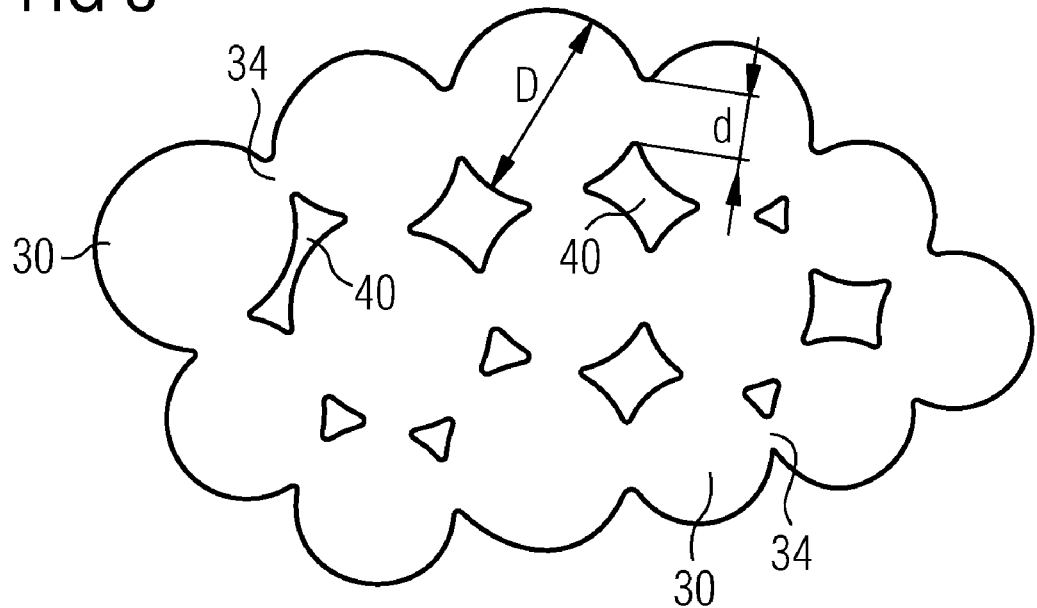
FIG. 3 is a schematic representation of the microstructure of a security layer.

FIG. 3 is a schematic representation of the microstructure of a sintered material, for example of the material described above with reference to FIG. 2 after it has been heated to a predetermined sintering temperature for a predetermined period of time. Due to the above described migration of material, bridges 34 are formed between the grains 30 instead of the mere contact points displayed in FIG. 2. The bridges 34 considerably increase the mechanical strength of the material, in particular the tensile strength.

It is obvious that a short term sintering process or a sintering process at a low temperature results in the formation of small bridges 34, while the bridges 34 grow with increasing temperature and/or increasing time. A degree of sintering can be defined as the ratio <d>/<D> of the mean value <d> of the diameters d of the bridges 34 and the mean value <D> of the diameters D of the grains 30. As an alternative, the degree of sintering can be defined as the rate of reduction of the total volume of the voids 40. As a further alternative, the degree of sintering is defined as the degree of densification or as the ratio of the densities of the material before and after the sintering process. As a further alternative, the degree of sintering can be defined on the basis of the ratio between the total volume of the grains 30 and the total volume of the material including the voids 40. Obviously many other definitions of the degree of sintering can be given as well.

It is further obvious that after the same process of sintering, the degree of sintering depends on the particular material and its properties, in particular on the melting point of the material of the grains 30. According to various embodiments, the piezoceramic layers 12 displayed in FIG. 1 comprise a piezoceramic first material, the security layers 20 comprise a second material and the inner electrodes 16, 18 comprise a third material. The entire piezoceramic multilayer actuator has been sintered at a sintering temperature for a predetermined period of time. Due to different material properties the degree of sintering of the second material comprised in the security layers 20 is lower than the degree of sintering of the third material comprised in the inner electrodes 16, 18. This is for example achieved by the melting point of the second material comprised in the security layers 20 being higher or much higher than the melting point of the third material comprised in the inner electrodes 16, 18.

Figure 4:
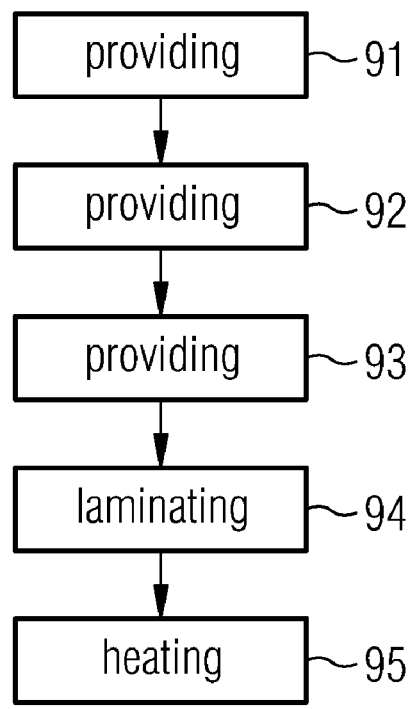
FIG. 4 is a schematic flow chart of a method of manufacturing a piezoceramic multilayer actuator.

FIG. 4 shows a schematic flow chart of a method of manufacturing a piezoceramic multilayer actuator. In a first step 91, a plurality of green sheets or green layers are provided which will be converted to piezoceramic layers in the course of the method. In a second step 92, a green security layer material is provided which will be converted to the security layer in the course of the method. In a third step 93, a green inner electrode material is provided which will be converted to an inner electrode material in the course of the method. In a fourth step 94, the green security layer material is laminated between a first one and a second one of the plurality of green layers, and the green inner electrode material is laminated between the second one and a third one of the plurality of green layers. In this way a green stack is formed. In a fifth step 95, the green stack is heated to a predetermined sintering temperature for a predetermined period of time. Thereby, the green layers are converted to the piezoceramic layers 12, the green security layer material is converted to the security layer material forming the security layers 20, and the green inner electrode material is converted to the inner electrode material forming the inner electrodes 16, 18. Due to the choice of the material of the green layers, due to the choice of the green security layer material, due to the choice of the green inner electrode material and due to the choice of the predetermined sintering temperature and the length of the predetermined period of time, each of the materials provides a desired degree of sintering after the step of heating 95. In particular, the degree of sintering of the security layer material is lower than the degree of sintering of the inner electrode material. For example, the inner electrode material is sintered while the security layer material is not sintered or essentially not sintered.

In this way it is achieved that the mechanical properties of the security layers 20 are weaker than the mechanical properties of the inner electrodes 16, 18. Preferably it can be in particular achieved that the tensile strength of the security layers 20 is lower than the tensile strength of the inner electrodes 16, 18. Therefore, the security layers 20 form predetermined breaking points within the entire piezoceramic multilayer actuator, and any mechanical strain within the piezoceramic multilayer actuator results in cracks which are localized or restricted to the security layers and cannot destroy the piezoceramic layers and the inner electrodes.

What is claimed is:

1. A piezoceramic multilayer actuator comprising:
   a plurality of piezoceramic layers comprising a piezoceramic first material sintered at a sintering temperature;
   a security layer comprising a second material and disposed between two piezoceramic layers; and
   a plurality of inner electrodes comprising a third material, each of the inner electrodes being deposited between two piezoceramic layers,
   wherein the degree of sintering of the second material is lower than the degree of sintering of the third material such that at least one of:
   (a) the degree of sintering within the second material is lower than the degree of sintering within the third material, and
   (b) the degree of sintering at the surfaces between the second material and the first material is lower than the degree of sintering at the surfaces between the third material and the first material.

2. The piezoceramic multilayer actuator according to claim 1, wherein the melting point of the second material is higher than the melting point of the third material.

3. The piezoceramic multilayer actuator according to claim 1, wherein the second material is essentially Pd or Pt.

4. The piezoceramic multilayer actuator according to claim 1, wherein the average ratio between the surface area and the volume of the grains of the second material is lower than the average ratio between the surface area and the volume of the grains of the third material.

5. The piezoceramic multilayer actuator according to claim 1, wherein the average size of the grains of the second material is larger than the average size of the grains of the third material.

6. The piezoceramic multilayer actuator according to claim 1, wherein the average shape of the grains of the second material is different from the average shape of the grains of the third material.

7. The piezoceramic multilayer actuator according to claim 1, wherein the surfaces of the grains of the second material are leached.

8. The piezoceramic multilayer actuator according to claim 1, wherein the grains of the second material provide a coating reducing the sintering activity.

9. A piezoceramic stack comprising:
a plurality of sub-stacks comprising a plurality of piezoceramic layers of a piezoceramic first material sintered at a sintering temperature;
a security layer comprising a second material and disposed between two adjacent sub-stacks; and
a plurality of inner electrodes comprising a third material, each of the inner electrodes being deposited between two piezoceramic layers,
wherein the degree of sintering of the second material is lower than the degree of sintering of the third material such that at least one of:
  (a) the degree of sintering within the second material is lower than the degree of sintering within the third material, and
  (b) the degree of sintering at the surfaces between the second material and the first material is lower than the degree of sintering at the surfaces between the third material and the first material.

10. The piezoceramic stack according to claim 9, wherein the melting point of the second material is higher than the melting point of the third material.

11. The piezoceramic stack according to claim 9, wherein the second material is essentially Pd or Pt.

12. The piezoceramic stack according to claim 9, wherein the average ratio between the surface area and the volume of the grains of the second material is lower than the average ratio between the surface area and the volume of the grains of the third material.

13. The piezoceramic stack according to claim 9, wherein the average size of the grains of the second material is larger than the average size of the grains of the third material.

14. The piezoceramic stack according to claim 9, wherein the average shape of the grains of the second material is different from the average shape of the grains of the third material.

15. The piezoceramic stack according to claim 9, wherein the surfaces of the grains of the second material are leached.

16. The piezoceramic stack according to claim 9, wherein the grains of the second material provide a coating reducing the sintering activity.

* * * * *